(12) United States Patent
Fry et al.

(10) Patent No.: US 10,418,077 B2
(45) Date of Patent: Sep. 17, 2019

(54) REALTIME STREAMING CONTROL OF AN ARBITRARY WAVEFORM GENERATOR

(71) Applicant: TEKTRONIX, INC., Beaverton, OR (US)

(72) Inventors: Brandon Z. Fry, Beaverton, OR (US); Geoffrey D. Cheren, Beaverton, OR (US); Brett Trevor, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 152 days.

(21) Appl. No.: 15/392,790

(22) Filed: Dec. 28, 2016

(65) Prior Publication Data

US 2018/0183412 A1    Jun. 28, 2018

(51) Int. Cl.
*G11C 7/10*     (2006.01)
*G11C 7/16*     (2006.01)
*G11C 29/56*    (2006.01)
*H03M 1/66*     (2006.01)

(52) U.S. Cl.
CPC .............. *G11C 7/1006* (2013.01); *G11C 7/16* (2013.01); *G11C 29/56016* (2013.01); *G11C 2029/5602* (2013.01); *G11C 2029/5606* (2013.01); *H03M 1/66* (2013.01)

(58) Field of Classification Search
CPC .............................. H03K 3/012; G11C 7/1006
USPC ......................................... 327/291, 113–114
See application file for complete search history.

(56) References Cited

U.S. PATENT DOCUMENTS 6,420,989 B1 * 7/2002 Herbold ................ H03L 7/0996
                                                  341/155
7,385,543 B2 * 6/2008 Jungerman ............... G06F 5/00
                                                  327/106

* cited by examiner

*Primary Examiner* — Dinh T Le
(74) *Attorney, Agent, or Firm* — Miller Nash Graham & Dunn; Andrew J. Harrington

(57) ABSTRACT

A device has a digital-to-analog converter to convert waveform data into analog waveforms, a waveform memory to store stored waveform data, an external waveform interface to receive real-time waveform data from an external device, a waveform multiplexer connected to the digital-to-analog converter to select between the first memory and the external waveform interface, a sequencer to receive and execute instructions to identify and access waveform data to drive the digital-to-analog converter, a sequencer instruction memory to provide stored instructions to the sequencer, an external instruction interface to receive real-time instructions for the sequencer, and a sequencer multiplexer to select between the sequencer instruction memory and the external instruction interface connected to the sequencer. A method of controlling a waveform generator includes selecting a mode of operation, where the mode of operation is selected from streaming waveform data, real-time waveform memory updates, real-time sequencer instructions, real-time sequencer instruction updates, and real-time sequencer flow control.

10 Claims, 3 Drawing Sheets

REALTIME STREAMING CONTROL OF AN ARBITRARY WAVEFORM GENERATOR

TECHNICAL FIELD

This disclosure relates to arbitrary waveform generators, more particularly to real-time streaming of waveforms.

BACKGROUND

Arbitrary waveform generators (AWGs) generate electrical waveforms. Typically, they function as testing equipment and provide waveforms to devices under test to allow the equipment to evaluate the performance of the device. AWGs can produce any arbitrarily defined wave shape as their output.

Traditionally, AWGs store wave form data in an onboard memory. The AWG outputs the waveform by retrieving the waveform data from memory, and converting to an analog signal by using a digital-to-analog converter (DAC). Users may design waveform data directly in the AWG, or in an external device such as a computer. The waveforms must then be loaded into the AWG's memory before they can be outputted.

The AWGs cannot read a waveform from memory while simultaneously trying to write a new waveform memory. Therefore, when a write of a new waveform occurs, the AWG output must pause while waveform data is being loaded or updated. This makes it difficult to change waveforms being outputted to the device under test in real time without interrupting the test or having to test small subsets at a time.

Embodiments discussed below address limitations of the present systems.

DETAILED DESCRIPTION

Figure 1:
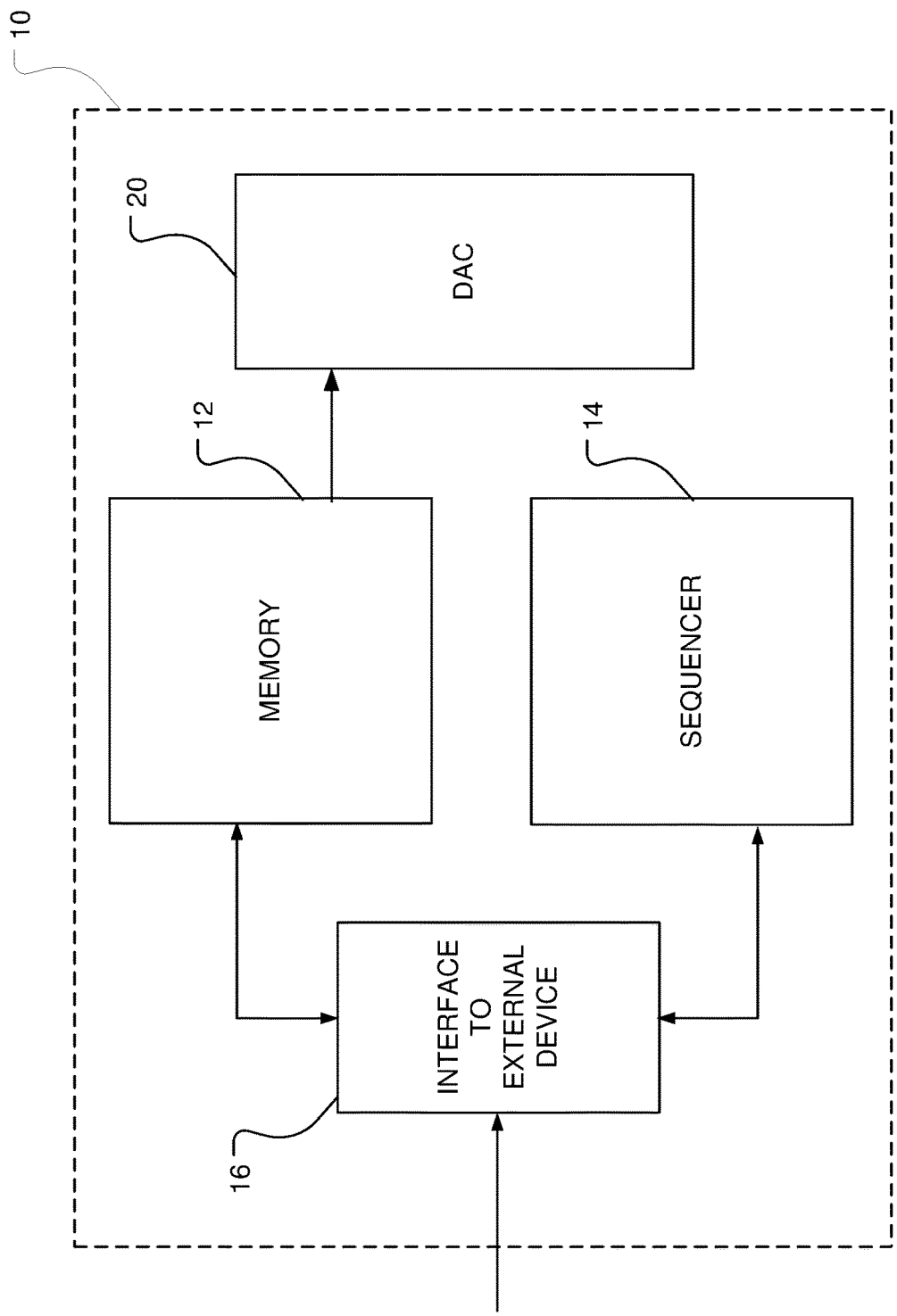
FIG. 1 shows a block diagram of an embodiment of an arbitrary waveform generator.

FIG. 1 shows a high level diagram of an arbitrary waveform generator (AWG) with an interface to external devices. The interface to an external device refers to an interface internal to the AWG that interfaces to an external computer or other type of device outside the AWG. Typically, users input instructions and waveform data through a user interface on the AWG and the processing element or elements in the AWG stores the instruction and waveform data in the system memory. The addition of the interface within the AWG allows external devices to provide data to the AWG.

While the AWG may have several different components, for purposes of discussion here the functions of the AWG have been split into the sequencer 14 and the memory 12. The processing element here consists of the sequencer 14. The AWG has two different resident memory segments, which may be part of the same memory or may be separate devices. One memory stores waveforms in memory to be processed by the DAC. The other stores sequence instructions for the sequencer. Sequence instructions are used to tell the AWG how to process the waveform data. Traditionally, the sequencer would fetch an instruction from the sequence instruction memory and then based on that instruction would extract waveform data out of memory to drive to the DAC. "Waveform data" refers to the data that is converted to an actual waveform by the DAC 20, and "waveform" refers to the resulting analog waveform produced by the DAC.

Figure 2:
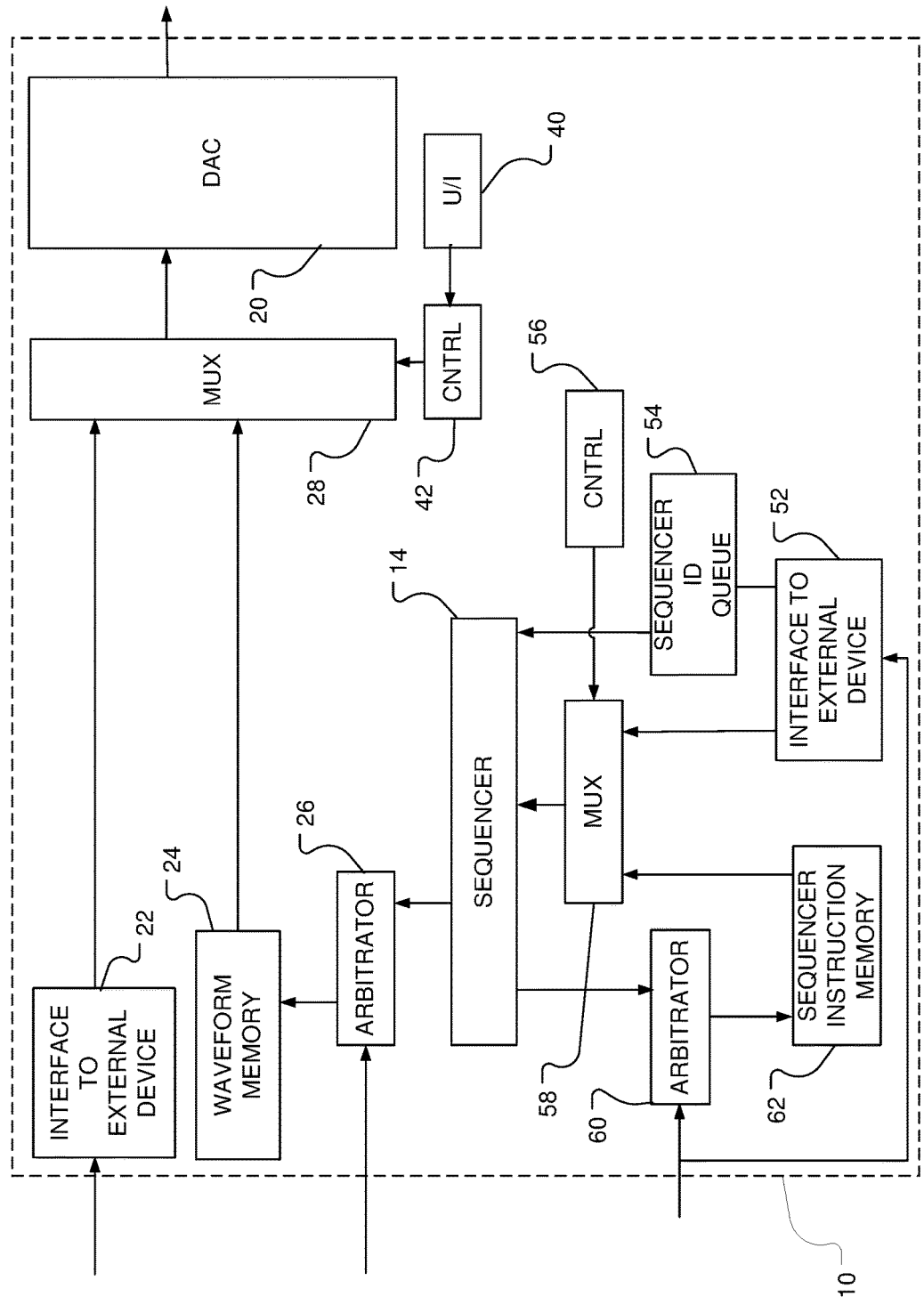
FIG. 2 shows a block diagram of a more detailed embodiment of an arbitrary waveform generator.

FIG. 2 shows a more detail embodiment of the AWG 10. In this view, the AWG memory 12 of FIG. 1 has a waveform memory 24, and a waveform memory arbitrator 26. The representative interface to external devices 16 of FIG. 1 may have several connections. In FIG. 2 the interface 22 connects to the waveform memory in the memory portion. While the digital analog converter 20 is common to both segments, for purposes of discussion here it will be discussed as part of the memory segment.

This architecture allows selection between waveform data from the waveform memory 24 and the external interface 22. The external interface 22 may consist of an interface to an external port through which real-time waveform data can be received from an external device, such as a personal computer or another computing device. The memory multiplexer 28 selects whether the DAC receives data from the waveform memory 24 or the interface to the external port 22. The selection may come from a control register 42. The control register 42 may receive a value that determines the selection, where the value is determined by a selection through a user interface 40.

The sequencer segment includes the sequencer/processor 50, a sequencer multiplexer 58, an arbitrator 60, a sequencer instruction memory 62, a sequencer external interface 52, and a sequencer identifier queue 54. A sequence identifier identifies the instructions that are to be extracted from the sequencer instruction memory 62. The multiplexer 58 selects between the sequencer instruction memory 62 and any sequencer instructions through the external interface 52 based upon a value in the control register 56. This segment also has an arbitrator 60.

Figure 3:
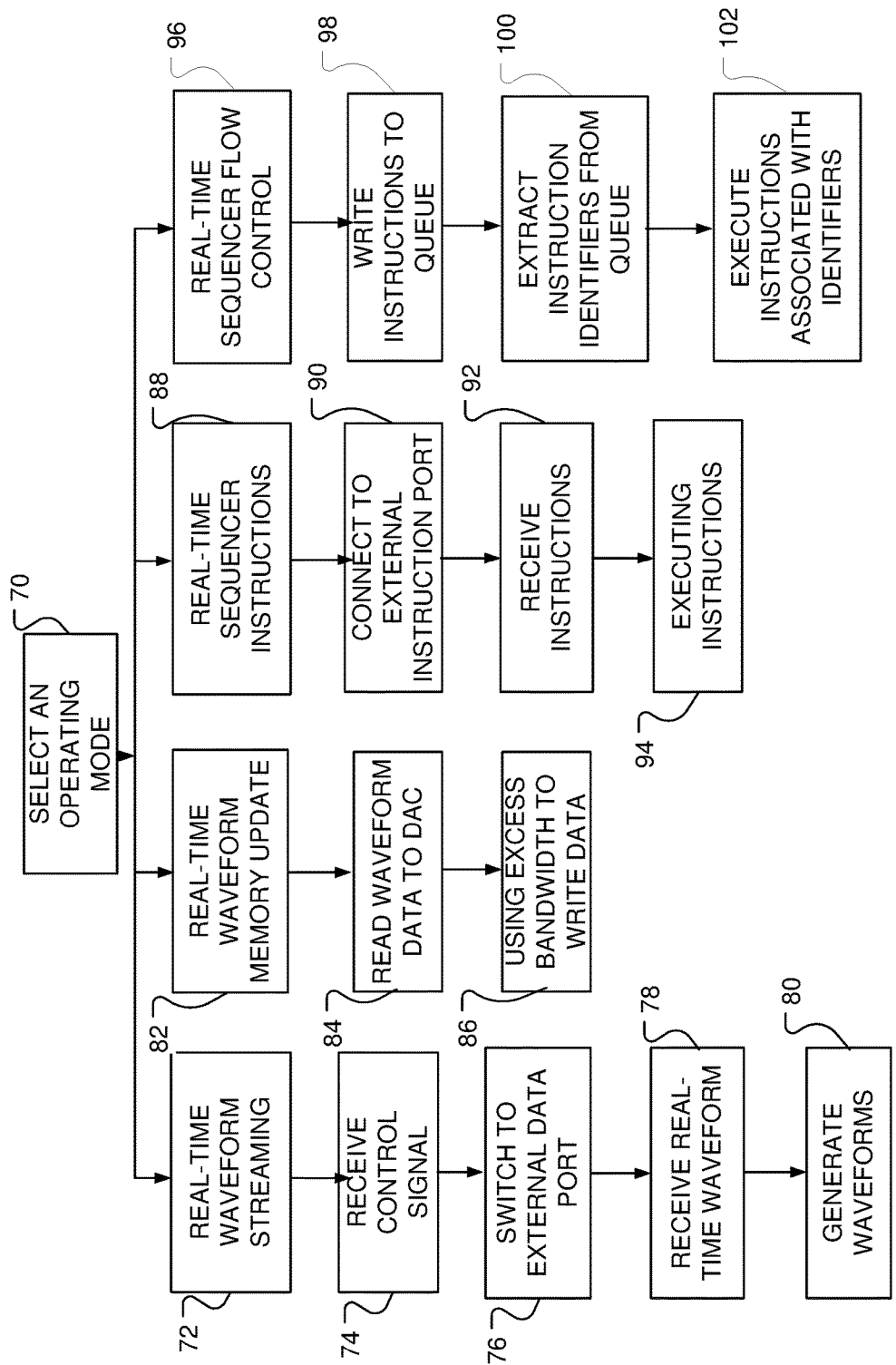
FIG. 3 shows a flow chart of one embodiment of a method of operating an arbitrary waveform generator.

This architecture allows for several different modes of operation, shown in FIG. 3. The mode of operation is selected at 70. One should note that the term 'selecting' may not actually be a selection between the four modes of operation per se. The user may make different selections based upon different menus and selections, rather than what may be implied by the statement of selecting an operating mode. These different capabilities are made possible by the architecture of FIG. 2.

The first mode discussed here is the real-time waveform streaming mode at 72. This mode allows the AWG to output waveform data directly from an external source instead of from memory. Instead of extracting data from the waveform memory 24, the waveform multiplexer 28 selects between the waveform memory 24 and the interface 22 to the external data port. The external data port, which may a Peripheral Component Interface express (PCIe), a serial bus, or an Ethernet connection, provides the AWG to receive waveform data from an external device that allows direct control of the data sent to the DAC. The waveform data may take the form of amplitude values, essentially DAC codes, IQ data, or any other format.

Bypassing the waveform memory allows output of waveform data as soon as it is received through the port. This speeds up the iterative development of a test waveform, allowing users to repeatedly test their waveforms, make modifications, and test their modifications without waiting for each waveform to load into memory. In summary, this mode sets the control register on the mux upon reception of the control signal at 74. This then switches the receiving of the DAC from the external data port at 76. The DAC then receives the real-time waveform data at 78 and generates the waveforms at 80.

Another mode of operation consists of a real-time waveform memory update at 82. This mode is like traditional DAC waveform processing except that is allows simultaneous read and write to memory while processing out waveforms. This removes the need to stop the output to modify and/or replace a waveform in memory. The memory arbitrator 26 controls the reading and writing of the waveform memory 24. The arbitrator first satisfies the bandwidth requirements of the DAC from the available bandwidth at 84. After the arbitrator meets the DAC bandwidth requirements, any extra bandwidth to allow writes into the system waveform memory at 86. The extra bandwidth may be all the available bandwidth at portions of dead times during the waveform processing. The updates to the waveform memory may come from the local AWG interfaces or from the external data port.

Yet another mode of operation involves real-time sequencer instructions at 88. This mode allows the sequencer instructions to be changed without having to pause or stop the AWG to load new instructions. The sequencer uses the multiplexer to select between the sequencer instruction memory 62 and the external interface 52, which may interface to a port of a bus at 90 such as those discussed before. The multiplexer makes this choice based upon the value in the control register 56. When the external interface is selected, instructions may come directly from an external source at 92. The sequencer then drives the waveform data from memory to the DAC based on the instruction received at 94.

An additional mode of operation is a real-time sequencer flow control mode at 96. This mode allows for real time changes in the flow of the waveforms without having to stop and load instructions in a different order. Using an external data port, such as those discussed above, a queue 54 can be written that contains the order of sequencer instructions to be executed at 98 in FIG. 3. The sequencer instruction identifiers are extracted from the queue at 100 based upon an external even or internally generated clock and then executed by the sequencer that causes the waveform to be produced by the DAC at 102.

In this manner, the AWG architecture can allow real-time inputs, for waveform data and sequencer instructions, and can allow simultaneous reading and writing to the waveform memory, updating instructions in the instruction memory and the ability to write instructions to a queue.

Although specific embodiments have been illustrated and described for purposes of illustration, it will be understood that various modifications may be made without departing from the spirit and scope of the claims.

What is claimed is:

1. A waveform generation device, comprising:
    a digital-to-analog converter to convert waveform data into analog waveforms;
    a waveform memory to store stored waveform data;
    an external waveform interface to receive real-time waveform data from an external device;
    a waveform multiplexer to select between the stored waveform data from the waveform memory and the real-time waveform data from the external waveform interface as the selected waveform data to drive the digital-to-analog converter, the waveform multiplexer connected to the digital-to-analog converter;
    a sequencer to receive and execute instructions to identify and access the selected waveform data to drive the digital-to-analog converter;
    a sequencer instruction memory to provide stored instructions to the sequencer;
    an external instruction interface to receive real-time instructions for the sequencer; and
    a sequencer multiplexer to select between the sequencer instruction memory and the external instruction interface, the sequencer multiplexer connected to the sequencer.

2. The device of claim 1, further comprising a waveform arbitrator to control loading of external data from an external data port to the external waveform interface.

3. The device of claim 2, wherein the external data port comprises one of a Peripheral Components Interface express (PCIe) bus, a serial bus, or an Ethernet port.

4. The device of claim 1, wherein the waveform multiplexer further comprises a control register.

5. The device of claim 1, wherein the waveform multiplexer further comprises a user interface to allow a user to set a value in the control register to control an operating mode of the multiplexer.

6. The device of claim 1, further comprising a sequencer arbitrator to control loading of the instructions into the sequencer through the external instruction interface from an external instruction port.

7. The device of claim 6, wherein the external instruction port comprises one of a Peripheral Components Interface express (PCIe) bus, a serial bus or an Ethernet connection.

8. The device of claim 1, wherein the sequencer multiplexer further comprises a control register.

9. The device of claim 8, wherein the sequencer further comprises a user interface to allow a user to set a value in the control register to control an operating mode of the multiplexer.

10. The device of claim 1, further comprising a sequencer instruction queue connected to the external instruction interface to allow an order of instructions to be written to the queue.

* * * * *